(12) United States Patent  
Wang

(10) Patent No.: US 10,884,442 B2  
(45) Date of Patent: Jan. 5, 2021

(54) BANDGAP REFERENCE POWER GENERATION CIRCUIT AND INTEGRATED CIRCUIT

(71) Applicant: AutoChips Inc., Hefei (CN)

(72) Inventor: Ke Wang, Hefei (CN)

(73) Assignee: AUTOCHIPS INC., Hefei (CN)

( * ) Notice: Subject to any disclaimer, the term of this patent is extended or adjusted under 35 U.S.C. 154(b) by 0 days.

(21) Appl. No.: 16/423,183

(22) Filed: May 28, 2019

(65) Prior Publication Data

US 2020/0272185 A1      Aug. 27, 2020

(30) Foreign Application Priority Data

Feb. 26, 2019   (CN) .......................... 2019 1 0141750

(51) Int. Cl.
| | |
|---|---|
| G05F 3/02 | (2006.01) |
| G05F 1/575 | (2006.01) |
| H03K 17/22 | (2006.01) |
| G05F 1/59 | (2006.01) |

(52) U.S. Cl.
CPC ............. G05F 1/575 (2013.01); G05F 1/59 (2013.01); H03K 17/22 (2013.01)

(58) Field of Classification Search
CPC ............ G05F 1/575; G05F 1/59; H03K 17/22
USPC .................................................. 327/143, 539
See application file for complete search history.

(56) References Cited

U.S. PATENT DOCUMENTS

| | | | | |
|---|---|---|---|---|
| 6,160,391 A * | 12/2000 | Banba | ..................... | G05F 3/242 323/313 |
| 7,148,672 B1 * | 12/2006 | Holmes | ..................... | G05F 3/30 323/316 |
| 7,589,513 B2 * | 9/2009 | Ogiwara | ..................... | G05F 3/30 323/314 |
| 7,852,142 B2 * | 12/2010 | Ogiwara | ..................... | G05F 3/30 327/538 |
| 8,008,966 B2 * | 8/2011 | Cho | ..................... | G05F 3/30 327/539 |
| 8,228,053 B2 * | 7/2012 | Stellberger | ............... | G05F 3/30 323/313 |
| 9,459,647 B2 * | 10/2016 | Hu | ..................... | G05F 3/30 |
| 10,061,340 B1 * | 8/2018 | Rao | ..................... | G05F 3/26 |
| 10,401,887 B2 * | 9/2019 | Huang | ..................... | G05F 1/565 |
| 2003/0201822 A1 * | 10/2003 | Kang | ..................... | G05F 3/30 327/539 |
| 2005/0237105 A1 * | 10/2005 | Park | ..................... | G05F 3/30 327/539 |
| 2007/0182479 A1 * | 8/2007 | Kim | ..................... | G05F 3/205 327/539 |
| 2007/0200616 A1 * | 8/2007 | Shin | ..................... | G05F 3/30 327/539 |

(Continued)

*Primary Examiner* — Ryan Jager

(57) ABSTRACT

The present disclosure discloses a bandgap reference power generation circuit and an integrated circuit. The bandgap reference power generation circuit includes a bias circuit and a bandgap reference core circuit. The bias circuit is configured to provide starting current according to a bias voltage. The bandgap reference core circuit is connected to the bias circuit to receive the starting current and goes into a stable operating state according to the starting current to output a preset voltage or preset current. The integrated circuit includes the bandgap reference power generation circuit. By the aforementioned method, the present disclosure can simplify a circuit design and reduce power consumption.

10 Claims, 7 Drawing Sheets

(56) References Cited

U.S. PATENT DOCUMENTS

2008/0224682 A1* 9/2008 Haiplik ............... G05F 3/30
  323/313
2016/0252923 A1* 9/2016 Nien .................. G05F 3/262
  323/313

* cited by examiner

BANDGAP REFERENCE POWER GENERATION CIRCUIT AND INTEGRATED CIRCUIT

CROSS-REFERENCE TO RELATED APPLICATIONS

This application claims priority to Chinese Patent Application No. 201910141750.3, filed on Feb. 26, 2019, the contents of which are herein incorporated by reference in their entireties.

TECHNICAL FIELD

The present disclosure relates to the field of electronic technologies, and more particularly, to a bandgap reference power generation circuit and an integrated circuit.

BACKGROUND

Almost all electronic systems use a bandgap circuit generation reference voltage source or a current source. A commonly used bandgap reference circuit is as shown in FIG. 1. The bandgap reference circuit generally includes at least one current mirror, which can include at least one metal-oxide-semiconductor field-effect transistor (MOSFET), at least one bipolar junction transistor (BJT), and at least one resistor network. VBG represents a generated reference voltage, Iout represents a generated current. The reference voltage generated by the circuit structure as shown in FIG. 1 is about 1.2V, which is closer to the bandgap of silicon. The output current Iout in FIG. 1 is a current proportional to absolute temperature (PTAT).

In a long-term research and development, it is found that a common idea for starting circuit is to detect some key node voltages or currents in the circuit, and inject a current into other key nodes through a negative feedback loop to assist in starting the circuit. The injection current is turned off after the startup is completed, and the starting circuit only consumes a small amount of quiescent current. Common voltage detection starting circuits may be roughly divided into four types as follows.

The first type of voltage detection starting circuit is based on an inverter. The advantage thereof is simple in structure and requires few devices. The disadvantage thereof is that the threshold of the inverter is very difficult to control, and the threshold change may easily reach or even exceed ±50% under the effect of the process, voltage, and temperature (PVT). The bandgap reference circuit as shown in FIG. 1 has an output voltage VBG of 1.2V in the event of a normal output. If a detection object is the output voltage VBG, an ideal detection threshold is 1.1V. Under the effect of PVT, the actual detection threshold may be 0.6~1.1V. Such a wide detection threshold is difficult to ensure that the starting circuit can be started under all PVT conditions. Actual experiences show that the output voltage VBG is likely about 0.6V~0.7V.

The second type of voltage detection starting circuit is based on a comparator. The advantage thereof is that the threshold may be controlled by a reference voltage. The disadvantages thereof lie in that an additional circuit is needed to obtain the reference voltage, the number of circuit devices is larger, and the static power consumption is larger. The reference voltage may be acquired by way of power supply resistor voltage division or a current source flowing through the BJT. However, the way of power supply resistor voltage division has low precision and thus is not suitable for application in a wide power supply range, but the way of current source flowing through the BJT has higher precision.

The third type of voltage detection starting circuit is also based on a comparator, but does not require a reference voltage Vref. A differential voltage between the input terminal VA and the input terminal VC is directly detected. This type of starting circuit is much better in robustness and may eliminate the effect of the PVT. The disadvantages thereof lie in that the number of devices is larger and the static power consumption is larger.

The threshold current of the fourth type of current detection starting circuit may be simply expressed as a ratio of the power supply voltage to the resistance. Its effect is not so good in application of a wide range of power supply voltage variation, and the current of the FET used is equal to that of a triode used, and power consumption is large.

SUMMARY

A problem to be mainly solved by the present disclosure is to provide a bandgap reference power generation circuit and an integrated circuit, which can simplify a circuit design and reduce power consumption.

To solve the above technical problem, a technical solution adopted by the present disclosure is to provide a bandgap reference power generation circuit, which includes a bias circuit and a bandgap reference core circuit. The bias circuit is configured to provide starting current according to a bias voltage. The bandgap reference core circuit is connected to the bias circuit to receive the starting current and goes into a stable operating state according to the starting current to output a preset voltage or preset current.

To solve the above technical problem, another technical solution adopted by the present disclosure is to provide an integrated circuit, which includes the bandgap reference power generation circuit.

Through the above solutions, beneficial effects of the present disclosure are as below. The bandgap reference power generation circuit provided by the present disclosure includes: a bias circuit and a bandgap reference core circuit. The bias circuit is configured to receive a bias voltage, output starting current according to the bias voltage, and provide the starting current to the bandgap reference core circuit, such that the bandgap reference core circuit goes into a stable operating state under the action of the starting current to output a stable preset voltage or preset current. The bias circuit itself does not extra consume power. After being started, it is unnecessary to turn off the starting current, the bias circuit can continuously provide the current to the bandgap reference core circuit, and it is unnecessary to detect a voltage using a detection circuit, which greatly simplifies a circuit design.

BRIEF DESCRIPTION OF THE DRAWINGS

In order to describe the technical solutions in the embodiments of the present disclosure more clearly, the following will briefly introduce the accompanying drawings required for describing the embodiments. Apparently, the accompanying drawings in the following description show merely some embodiments of the present disclosure, and a person of ordinary skill in the art may still derive other drawings from these accompanying drawings without creative efforts. In the drawings.

DETAILED DESCRIPTION

A clear and complete description of the technical solutions in the embodiments of the present disclosure will be made below with reference to the accompanying drawings in the embodiments of the present disclosure. Apparently the embodiments as recited herein are merely a part of embodiments of the present disclosure instead of all embodiments. All other embodiments obtained by a person of ordinary skill in the art based on the embodiments of the present disclosure without creative efforts shall fall within the protection scope of the present disclosure.

For a bandgap reference circuit without a starting circuit, it may stay at an undesired steady state due to the presence of a plurality of steady states. In addition, some starting circuits do not constrain the number of circuit steady states to only one, but only drive the bandgap reference circuit to stay at a preset steady state during the power-on process. These starting circuits are greatly affected by the PVT and the power-on speed.

Figure 1:
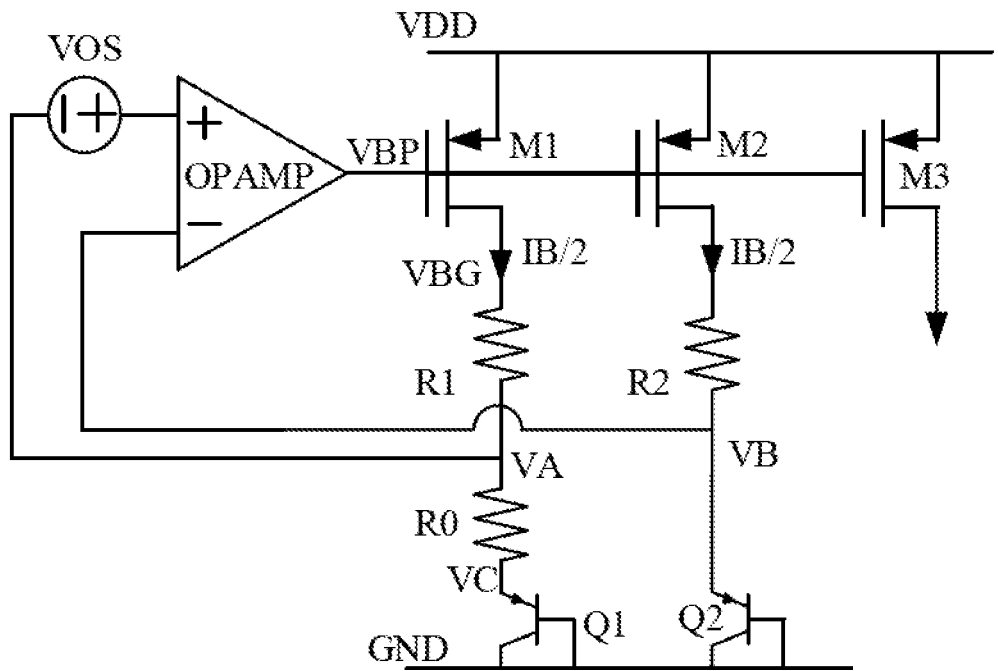
FIG. 1 is a schematic structural diagram of a bandgap reference circuit in the prior art.
Figure 2:
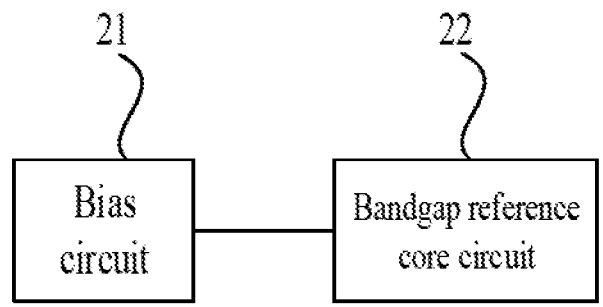
FIG. 2 is a schematic structural diagram of a bandgap reference power generation circuit according to a first embodiment of the present disclosure.

Referring to FIG. 2, a schematic structural diagram of a bandgap reference power generation circuit according to a first embodiment of the present disclosure is illustrated, the bandgap reference power generation circuit includes a bias circuit 21 and a bandgap reference core circuit 22.

The bias circuit 21 is configured to provide a starting current according to a bias voltage. Furthermore, the bias circuit 21 is configured to receive the bias voltage, generate the starting current according to the bias voltage, and provide the starting current to the bandgap reference core circuit 22. The bias circuit 21 itself does not extra consume power.

The bandgap reference core circuit 22 is connected to the bias circuit 21 to receive the starting current and goes into a stable operating state according to the starting current to output a preset voltage or a preset current. The bandgap reference core circuit 22 is configured to receive the starting current, and go into a stable operating state, driven by the starting current, to output a preset current or a preset voltage.

The bias circuit 21 works in synergy with the bandgap reference core circuit 22. When the bandgap reference core circuit 22 outputs a stable preset voltage or a preset current, the bias circuit 21 is still in the operating state, and continuously provides the starting current to the bandgap reference core circuit 22. After being started, it is unnecessary to turn off the starting current, the bias circuit 21 has no feedback loop, and it is unnecessary to detect a voltage of the bandgap reference core circuit 22 using a detection circuit, which greatly simplifies a circuit design. A current provided by the bias circuit 21 accounts for a preset proportion of the preset current.

In a specific embodiment, the bandgap reference core circuit 22 outputs a stable preset current, and the starting current provided by the bias circuit 21 accounts for 0.05~0.3 of the preset current. For example, when the preset current is 20 μA, the starting current output by the bias circuit 21 may range from 1 μA to 6 μA.

The bandgap reference power generation circuit provided by this embodiment may be applied to any integrated circuit system needing a bandgap reference circuit, such as a system on chip (SoC), a microcontroller unit (MCU), a field programmable gate array (FPGA), and a power management unit (PMU), etc.

The bandgap reference power generation circuit provided by this embodiment includes a bias circuit 21 and a bandgap reference core circuit 22. The bias circuit 21 is configured to receive a bias voltage, output a starting current under the drive of the bias voltage, and provide the starting current to the bandgap reference core circuit 22, such that the bandgap reference core circuit 22 goes into a stable operating state under the action of the starting current to output a stable preset voltage or a preset current. The bias circuit 21 itself does not extra consume power. After being started, it is unnecessary to turn off the starting current, the bias circuit 21 can continuously provide the current to the bandgap reference core circuit 22, and it is unnecessary to detect a voltage using a detection circuit, which greatly simplifies a circuit design.

Figure 3:
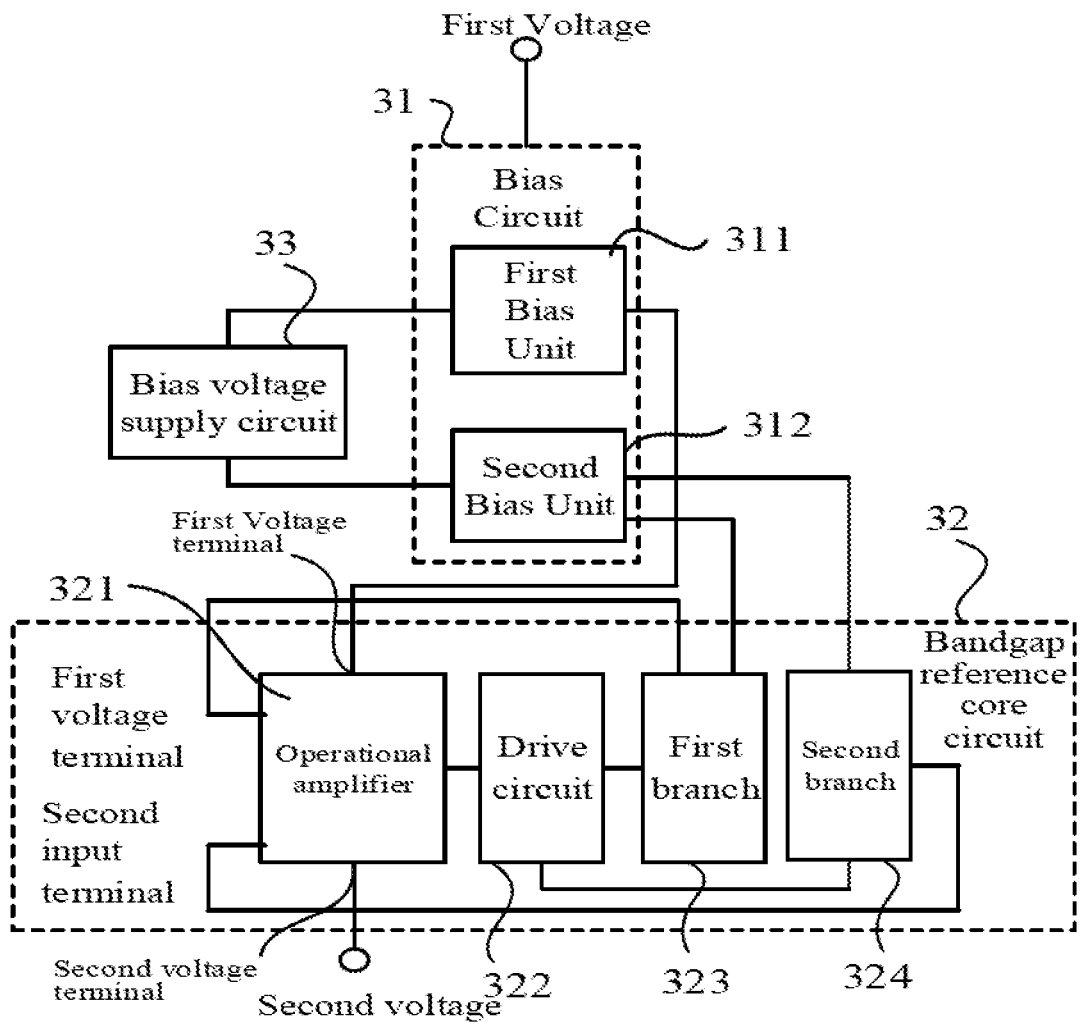
FIG. 3 is a schematic structural diagram of a bandgap reference power generation circuit according to a second embodiment of the present disclosure.

Referring to FIG. 3, a schematic structural diagram of a bandgap reference power generation circuit according to a second embodiment of the present disclosure is illustrated, the bandgap reference power generation circuit includes a bias circuit 31, a bandgap reference core circuit 32, and a bias voltage supply circuit 33.

The bias voltage supply circuit 33 is connected to the bias circuit 31 to supply a bias voltage to the bias circuit 31. The bias voltage supply circuit 33 may provide a bias voltage to the bias circuit 31, such that the bias circuit 31 outputs a starting current to the bandgap reference core circuit 32 according to the bias voltage.

The bias circuit 31 includes a first bias unit 311 and a second bias unit 312.

The first bias unit 311 is connected to the bias voltage supply circuit 33 and is connected between a first voltage and a first voltage terminal of an operational amplifier 321. When the bias voltage supply circuit 33 provides the bias voltage, the first bias unit 311 is started to enable a pathway between the first voltage and the first voltage terminal of the operational amplifier 321, such that the operational amplifier 321 is enabled.

The second bias unit 312 is connected to the bias voltage supply circuit 33 and is connected between the first voltage and a first branch 323 and a second branch 324. When the bias voltage supply circuit 33 provides the bias voltage, the second bias unit 312 is started to enable a pathway between the first voltage and the first branch 323 and the second branch 324, such that a starting current is provided to the first branch 323 and the second branch 324.

The bandgap reference core circuit 32 is connected to the bias circuit 31 to receive the starting current and goes into a stable operating state according to the starting current to output a preset voltage or a preset current. The bandgap reference core circuit 32 includes an operational amplifier 321, a drive circuit 322, a first branch 323, and a second branch 324.

The operational amplifier 321 is connected to the bias circuit 31 such that a first voltage terminal of the operational amplifier 321 is connected to a first voltage via the bias circuit 31, and that a second voltage terminal of the operational amplifier 321 is connected to a second voltage. The first voltage terminal of the operational amplifier 321 may be a power terminal, and the second voltage terminal of the operational amplifier 321 may be a ground terminal. The starting current output by the bias circuit 31 also may be employed to provide a bias current to the operational amplifier 321.

The drive circuit 322 is connected to an output terminal of the operational amplifier 321, such that a magnitude of an output current of the drive circuit 322 is determined according to an output of the operational amplifier 321.

The first branch 323 is connected to the drive circuit 322 and the bias circuit 31 to receive the starting current and receive, when the drive circuit 322 is enabled, a drive current provided by the drive circuit 322. The first branch 323 is further connected to a first input terminal of the operational amplifier 321 to provide a first feedback voltage to the first input terminal of the operational amplifier 321, and the first input terminal of the operational amplifier 321 may be a non-inverting input terminal.

The second branch 324 is connected to the drive circuit 322 and the bias circuit 31 to receive the starting current and receive, when the drive circuit 322 is enabled, a drive current provided by the drive circuit 322. The second branch 324 is further connected to a second input terminal of the operational amplifier 321 to provide a second feedback voltage to the second input terminal of the operational amplifier 321, and the second input terminal of the operational amplifier 321 may be an inverting input terminal.

The first branch 323 and the second branch 324 are connected between the first voltage and the second voltage through the drive circuit 322 and/or the bias circuit 31 respectively. The first branch 323 and/or the second branch 324 are driven by the starting current provided by the bias circuit 31, such that the operational amplifier 321 goes into a stable operating state according to the first feedback voltage fed back by the first branch 323 and/or the second feedback voltage fed back by the second branch 324.

In this embodiment, the bias voltage supply circuit 33 is used to provide the bias voltage to the first bias unit 311 and the second bias unit 312. Driven by the bias voltage, the first bias unit 311 and the second bias unit 312 output the starting current to the operational amplifier 321, the first branch 323, and/or the second branch 324, such that the operational amplifier 321 gradually goes into a stable operating state, thereby outputting a stable preset voltage or a preset current. It is unnecessary to turn off the bias circuit 31 after the bias circuit 31 completes starting the bandgap reference core circuit 32, such that the bias circuit 31 can continuously provide a current to the operational amplifier 321, the first branch 323, and/or the second branch 324, and it is unnecessary to detect a voltage using a detection circuit, which greatly simplifies a circuit design.

Figure 4:
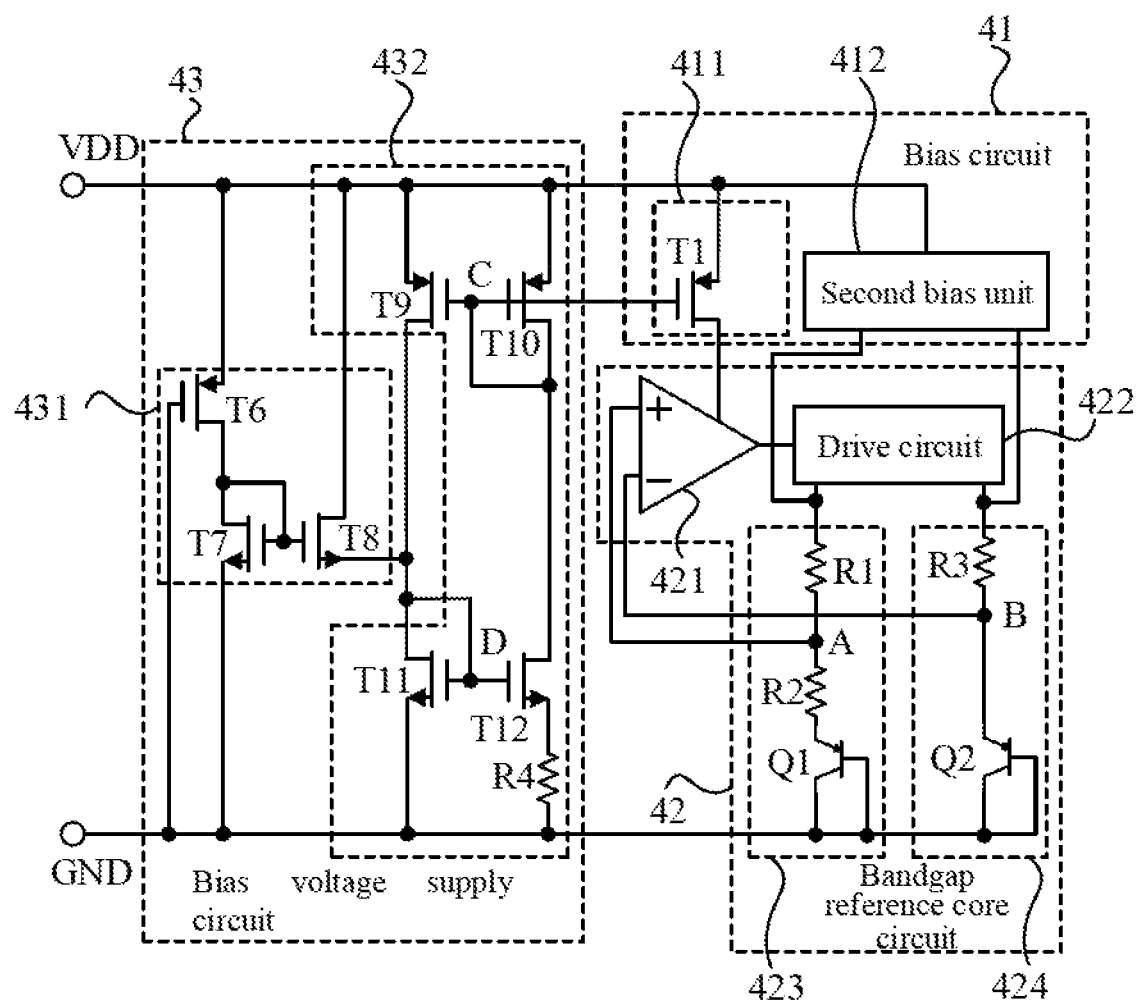
FIG. 4 is a schematic structural diagram of a bandgap reference power generation circuit according to a third embodiment of the present disclosure.

Referring to FIG. 4, a schematic structural diagram of a bandgap reference power generation circuit according to a third embodiment of the present disclosure is illustrated, the bandgap reference power generation circuit includes a bias circuit 41, a bandgap reference core circuit 42, and a bias voltage supply circuit 43.

The bias circuit 41 includes: a first bias unit 411 and a second bias unit 412. The first bias unit 411 includes a first transistor T1, which includes a control terminal, a first pathway terminal and a second pathway terminal. The control terminal of the first transistor T1 is connected to the bias voltage supply circuit 43 to receive the bias voltage, the first pathway terminal of the first transistor T1 is connected to the first voltage VDD, and the second pathway terminal of the first transistor T1 is connected to the first voltage terminal of the operational amplifier 421.

The bandgap reference core circuit 42 includes an operational amplifier 421, a drive circuit 422, a first branch 423, and a second branch 424.

The first branch 423 includes a first resistor R1, a second resistor R2, and a first triode Q1. The first resistor R1 and the second resistor R2 are connected in series, and a junction therebetween is defined as a first node A. The first node A is connected to the first input terminal of the operational amplifier 421 to feed back the first feedback voltage to the first input terminal of the operational amplifier 421. As the input terminal of the first branch 423, and end of a non-first node of the first resistor R1 is connected to the drive circuit 422 and/or the bias circuit 41. An end of a non-first node of the second resistor R2 is connected to an emitter of the first triode Q1, and a base and a collector of the first triode Q1 are connected to the second voltage GND, wherein the first triode Q1 may be a PNP type triode.

The second branch 424 includes a third resistor R3 and a second triode Q2. The third resistor R3 is connected to an emitter of the second triode Q2, and a junction therebetween is defined as a second node B. The second node B is connected to the second input terminal of the operational amplifier 421 to feed back the second feedback voltage to the second input terminal of the operational amplifier 421. As the input terminal of the second branch 424, and end of a non-second node of the third resistor R3 is connected to the drive circuit 422 and/or the bias circuit 41. A base and a collector of the second triode Q2 are connected to the second voltage GND, wherein the second triode Q2 may be a PNP type triode.

The bias voltage supply circuit 43 includes a starting circuit 431 and a constant transconductance circuit 432.

The constant transconductance circuit 432 is configured to provide the bias voltage. The starting circuit 431 is connected to the constant transconductance circuit 432 to start the constant transconductance circuit 432 when being powered on, such that the constant transconductance circuit 432 provides the bias voltage to the bias circuit 41.

The starting circuit 431 includes a sixth transistor T6, a seventh transistor T7, and an eighth transistor T8.

The sixth transistor T6 includes a control terminal, a first pathway terminal, and a second pathway terminal. The control terminal of the sixth transistor T6 is connected to the second voltage GND, and the first pathway terminal of the sixth transistor T6 is connected to the first voltage VDD. The sixth transistor T6 may be a positive channel metal oxide semiconductor (PMOS).

The seventh transistor T7 includes a control terminal, a first pathway terminal, and a second pathway terminal. The control terminal of the seventh transistor T7 is connected to the second pathway terminal of the sixth transistor T6, the first pathway terminal of the seventh transistor T7 is connected to the second voltage GND, and the second pathway terminal of the seventh transistor T7 is connected to the second pathway terminal of the sixth transistor T6. The seventh transistor T7 may be a negative channel metal oxide semiconductor (NMOS).

The eighth transistor T8 includes a control terminal, a first pathway terminal, and a second pathway terminal. The control terminal of the eighth transistor T8 is connected to the second pathway terminal of the sixth transistor T6, the first pathway terminal of the eighth transistor T8 is connected, as the output terminal of the starting circuit 431, to the constant transconductance circuit 432, and the second pathway terminal of the eighth transistor T8 is connected to the first voltage VDD. The eighth transistor T8 may be an NMOS transistor.

The constant transconductance circuit 432 includes a ninth transistor T9, a tenth transistor T10, an eleventh transistor T11, a twelfth transistor T12, and a fourth resistor R4.

The ninth transistor T9 includes a control terminal, a first pathway terminal, and a second pathway terminal. The first pathway terminal of the ninth transistor T9 is connected to the first voltage VDD, and the second pathway terminal of the ninth transistor T9 is connected to the first pathway terminal of the eighth transistor T8. The ninth transistor T9 may be a PMOS transistor.

The tenth transistor T10 includes a control terminal, a first pathway terminal, and a second pathway terminal. The first pathway terminal of the tenth transistor T10 is connected to the first voltage VDD, the control terminal of the tenth transistor T10 and the second pathway terminal of the tenth transistor T10 are connected to the control terminal of the ninth transistor T9, and a connection point therebetween is defined as a third node C. As the output terminal of the constant transconductance circuit 432, the third node C outputs the bias voltages. The tenth transistor T10 may be a PMOS transistor.

The eleventh transistor T11 includes a control terminal, a first pathway terminal, and a second pathway terminal. The first pathway terminal of the eleventh transistor T11 is connected to the second voltage GND, the control terminal of the eleventh transistor T11 and the second pathway terminal of the eleventh transistor T11 are connected together and are connected to the second pathway terminal of the ninth transistor T9, and a connection point therebetween is defined as a fourth node D. The fourth node D is connected, as the input terminal of the constant transconductance circuit 432, to the output terminal of the starting circuit 431. The eleventh transistor T11 may be an NMOS transistor.

The twelfth transistor T12 includes a control terminal, a first pathway terminal, and a second pathway terminal. The control terminal of the twelfth transistor T12 is connected to the fourth node D, and the second pathway terminal of the twelfth transistor T12 is connected to the third node C. The twelfth transistor T12 may be an NMOS transistor.

The fourth resistor R4 includes a first terminal and a second terminal. The first terminal of the fourth resistor R4 is connected to the first pathway terminal of the twelfth transistor T12, and the second terminal of the fourth resistor R4 is connected to the second voltage GND.

The control terminal, the first pathway terminal and the second pathway terminal of each of the transistors (the first transistor T1 to the thirteenth transistor T13) in this embodiment may be a gate, a source and a drain respectively.

Figure 5:
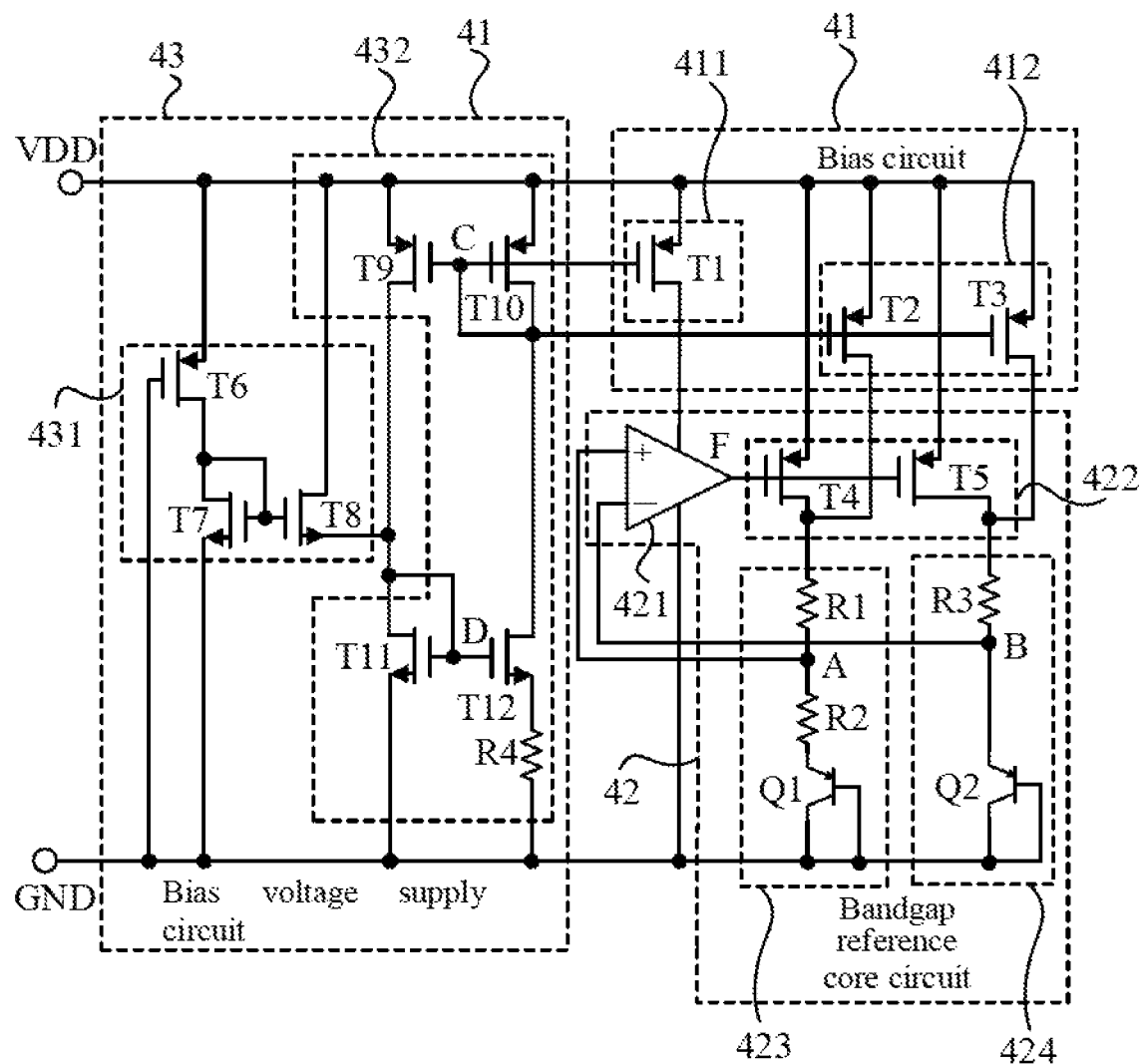
FIG. 5 is a schematic structural diagram of a second bias unit and a drive circuit in FIG. 4.

In a specific embodiment, as shown in FIG. 5, the second bias unit 412 includes a second transistor T2 and a third transistor T3. The drive circuit 422 includes a fourth transistor T4 and a fifth transistor T5. The second transistor T2, the third transistor T3, the fourth transistor T4 and the fifth transistor T5 may be PMOS transistors.

The second transistor T2 includes a control terminal, a first pathway terminal and a second pathway terminal. The control terminal of the second transistor T2 is connected to the bias voltage supply circuit 43 to receive the bias voltage, the first pathway terminal of the second transistor T2 is connected to the first voltage VDD, and the second pathway terminal of the second transistor T2 is connected to the first branch 423.

The third transistor T3 includes a control terminal, a first pathway terminal and a second pathway terminal. The control terminal of the third transistor T3 is connected to the bias voltage supply circuit 43 to receive the bias voltage, the first pathway terminal of the third transistor T3 is connected to the first voltage VDD, and the second pathway terminal of the third transistor T3 is connected to the second branch 424.

The fourth transistor T4 includes a control terminal, a first pathway terminal and a second pathway terminal. The control terminal of the fourth transistor T4 is connected to the output terminal of the operational amplifier 421, the first pathway terminal of the fourth transistor T4 is connected to the first voltage VDD, and the second pathway terminal of the fourth transistor T4 is connected to the first branch 423.

The fifth transistor T5 includes a control terminal, a first pathway terminal and a second pathway terminal. The control terminal of the fifth transistor T5 is connected to the output terminal of the operational amplifier 421, the first pathway terminal of the fifth transistor T5 is connected to the first voltage VDD, and the second pathway terminal of the fifth transistor T5 is connected to the second branch 424.

After the starting circuit 431 starts the constant transconductance circuit 432, the eighth transistor T8 is disabled, not affecting the constant transconductance circuit 432 anymore, whereas the sixth transistor T6 and the seventh transistor T7 are still enabled, without affecting other circuits.

The first branch 423 and the second branch 424 are respectively driven by two transistors. Specifically, the first branch 423 is driven by the second transistor T2 and the fourth transistor T4, whereas the second branch 424 is driven by the third transistor T3 and the fifth transistor T5.

In the bias circuit 41 for starting the bandgap reference core circuit 42 provided in this embodiment, an output current IB includes a fixed bias or self-bias starting current, whose value typically is 0.05~0.2 time of a design value of the output current IB, even if in the beginning the starting current VBP is equal to VDD, there is current large enough to drive the triodes Q1 and Q2, such that VB-VA is greater than 10 mV, thereby triggering a positive feedback loop to complete the startup.

The gate of the fourth transistor T4 and the gate of the fifth transistor T5 are driven by an output voltage VF of the operational amplifier 421, which is in the feedback loop. The second transistor T2 and the third transistor T3 are driven by an output voltage VC from the constant transconductance circuit 432, which is not in the feedback loop. The parameters of the second transistor T2 are the same as those of the fourth transistor T4, and the parameters of the third transistor T3 are the same as those of the fifth transistor T5. The ratio of the current of the fourth transistor T4 to the current of the second transistor T2 or the ratio of the current of the fifth transistor T5 to the current of the third transistor T3 theoretically may take any value between 0.01 and 1. To leave a sufficient margin in the actual design, the preferred design value of the ratio of current is 0.1 to 0.2.

After the first voltage VDD is powered on, the bias circuit 41 is started first. In the worst case, at the very beginning, the voltage VA of the first node A is equal to the voltage VB of the second node B, having a value of 0V, the output voltage VF of the operational amplifier 421 is equal to the first voltage VDD, both the fourth transistor T4 and the fifth transistor T5 are disabled, and the second transistor T2 and the third transistor T3 output a current to drive the first triode Q1 and the second triode Q2 to rise the voltage VA of the first node A and the voltage VB of the second node B.

The current of the second transistor T2 and the current of the third transistor T3 are designed enough to ensure that VB−VA>10 mV>VOS, wherein VOS represents an input offset voltage, thus a positive feedback loop may be triggered. When the voltage VB of the second node B rises, the voltage of the second input terminal of the operational amplifier 421 rises, but the output voltage VF of the operational amplifier 421 decreases. Since the fifth transistor T5 is a PMOS transistor, the output voltage of the fifth transistor T5 rises, thereby causing the voltage VB of the second node B to rise, and thus the positive feedback loop is formed. At this moment, the operational amplifier 421 is in a nonlinear region or a saturated state, the negative feedback is much less than the positive feedback. The positive feedback loop causes the voltage VA of the first node A and the voltage VB of the second node B to continuously rise, causing the difference value between the voltage VA of the first node A and the voltage VB of the second node B to be gradually decreased. The operational amplifier 421 gradually transitions from the nonlinear region to a linear region, and the negative feedback loop gradually starts to function. The voltage VA of the first node A rises, such that the voltage of the first input terminal of the operational amplifier 421 rises and the voltage VF of the output terminal of the operational amplifier 421 rises. The output voltage of the fourth transistor T4 and the output voltage of the fifth transistor T5 decrease, such that the voltage VA of the first node A is lowered to form a negative feedback loop. Finally, the voltage VA of the first node A is approximately equal to the voltage VB of the second node B, and the negative feedback loop and the positive feedback loop operate simultaneously. Due to asymmetrical characteristic of the first branch 423 and the second branch 424, the negative feedback loop is greater in gain than the positive feedback loop, such that a net feedback is a negative feedback, the circuit operates in a steady state, and the startup is completed.

Figure 6:
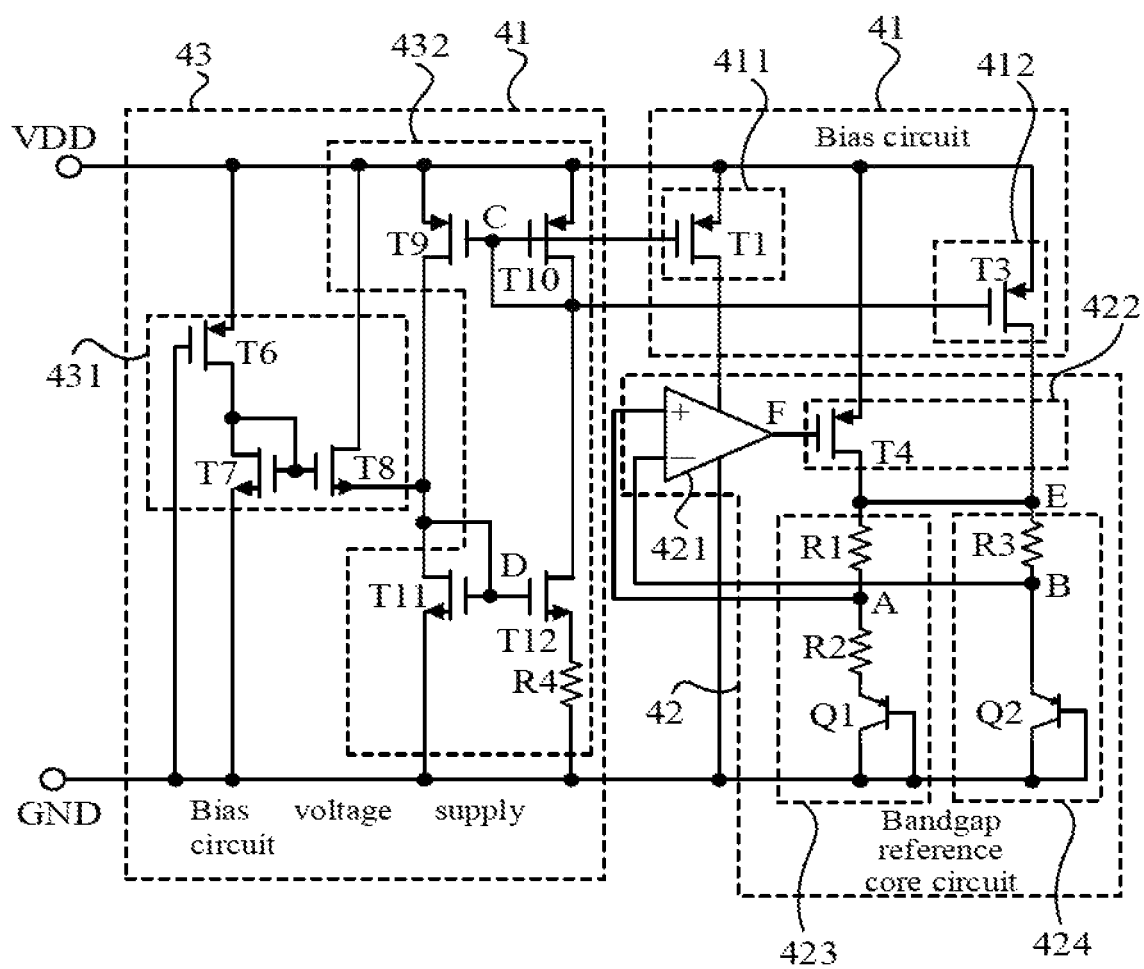
FIG. 6 is another schematic structural diagram of a second bias unit and a drive circuit in FIG. 4.

In another specific embodiment, as shown in FIG. 6, the second bias unit 412 includes a third transistor T3, and the drive circuit 422 includes a fourth transistor T4.

The third transistor T3 includes a control terminal, a first pathway terminal and a second pathway terminal. The control terminal of the third transistor T3 is connected to the bias voltage supply circuit 43 to receive the bias voltage, the first pathway terminal of the third transistor T3 is connected to the first voltage VDD, and the second pathway terminal of the third transistor T3 is connected to the first branch 423 and the second branch 424. In other embodiments, the third transistor T3 may be replaced with a resistor.

The fourth transistor T4 includes a control terminal, a first pathway terminal and a second pathway terminal. The control terminal of the fourth transistor T4 is connected to the output terminal of the operational amplifier 421, the first pathway terminal of the fourth transistor T4 is connected to the first voltage VDD, and the second pathway terminal of the fourth transistor T4 is connected to the first branch 423 and the second branch 424.

The drive current of the first triode Q1 and the drive current of the second triode Q2 are supplied by the fourth transistor T4 and the third transistor T3. The gate of the fourth transistor T4 is driven by the output voltage VF of the operational amplifier 421, which is in the feedback loop. The gate of the third transistor T3 is biased by the output voltage VC of the constant transconductance circuit 432, and is not in the feedback loop. The startup process is similar to that of the above embodiments, and thus details are omitted herein.

Figure 7:
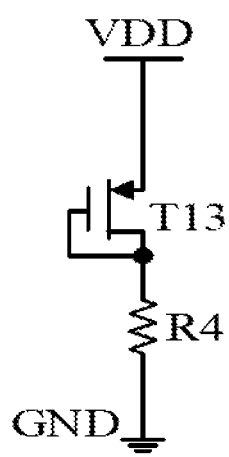
FIG. 7 is another schematic structural diagram of a bias voltage supply circuit according to the present disclosure.

It is to be understood that, in other embodiments, the bias voltage supply circuit 43 may also be of the circuit structure as shown in FIG. 7, including a thirteenth transistor T13 and a fourth resistor R4. The thirteenth transistor T13 includes a control terminal, a first pathway terminal and a second pathway terminal. The first pathway terminal of the thirteenth transistor T13 is connected to the first voltage VDD, the control terminal of the thirteenth transistor T13 is connected to the second pathway terminal of the thirteenth transistor T13, and the connection point therebetween serves as an output terminal of the bias voltage supply circuit 43 to output the bias voltage. The fourth resistor R4 includes a first terminal and a second terminal, wherein the first terminal of the fourth resistor R4 is connected to the second pathway terminal of the thirteenth transistor T13, and the second terminal of the fourth resistor R4 is connected to the second voltage GND.

Although fourth resistor R4 in the circuit as shown in FIG. 7 is larger than the resistor used in FIG. 4, the fourth resistor R4 in the circuit as shown in FIG. 7 requires no matching, and thus the minimum size design may be adopted. Furthermore, this circuit is larger in current range than the bias voltage supply circuit 43 as shown in FIG. 4. However, the operational amplifier 421 and the starting current have low requirements for accuracy of the current source, and thus the adverse effect is little.

In this embodiment, the output current is split into two portions, one portion is a fixed current source that is not controlled by the loop, which is a current supplied by the constant transconductance circuit 432; whereas the other portion is controlled by the loop composed of the operational amplifier 421, which is automatically adjusted according to voltage or the temperature variation. The fixed current source drives the first branch 423 and the second branch 424 of the bandgap reference core circuit 42 to be started. The starting current does not need to be turned off after the startup is completed. The ratio of the fixed current source to the output current varies with different circuit structures of the bias voltage supply circuit 43.

The starting current does not need to be turned off after the startup is completed, and thus the starting circuit 431 has no feedback loop and does not need a detection circuit, which greatly simplifies the design. The selection range of the starting current is wide, the implementation is relatively easy, and the robustness is strong, and thus the starting circuit 431 can work almost in various PVT conditions. The bias circuit 41 has no additional power consumption, because the starting current itself is a portion of the output current.

Therefore, the bandgap reference power generation circuit provided by this embodiment may greatly simplify the design, and does not need to design a comparator or an inverter detection circuit, does not need to consider threshold detection, has strong robustness, and is hardly affected by PVT. The bias circuit 41 itself does not consume additional power.

Figure 8:
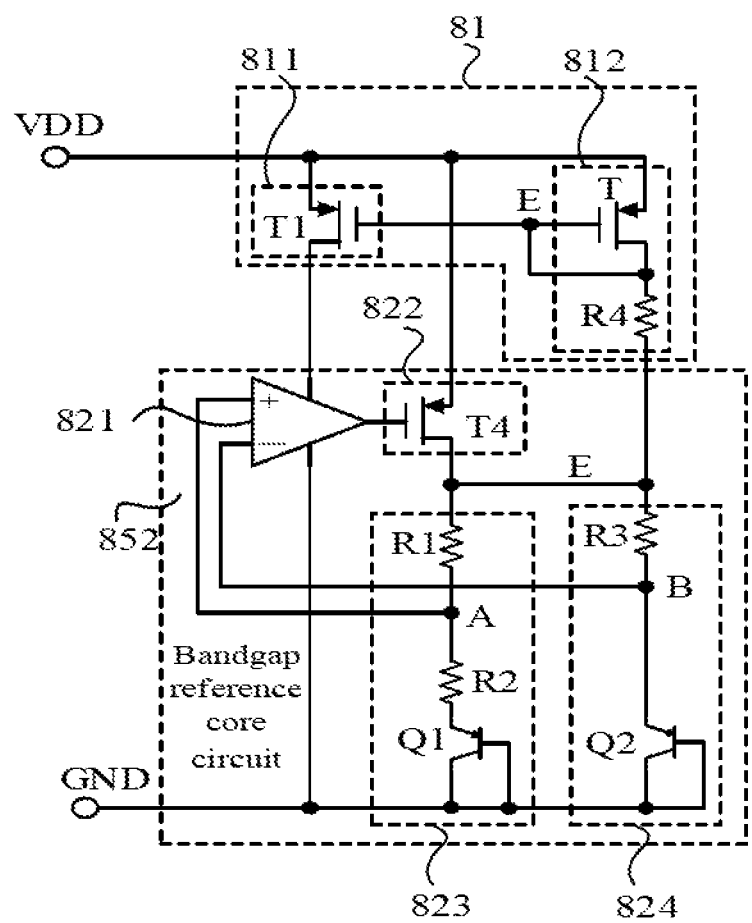
FIG. 8 is a schematic structural diagram of a bandgap reference power generation circuit according to a fourth embodiment of the present disclosure.

Referring to FIG. 8, a schematic structural diagram of a bandgap reference power generation circuit according to a fourth embodiment of the present disclosure is illustrated. In this embodiment, the bandgap reference power generation circuit includes a bias circuit 81 and a bandgap reference core circuit 82.

The bias circuit 81 includes a first bias unit 811 and a second bias unit 812.

The first bias unit 811 is connected between the first voltage VDD and a first voltage terminal of the operational amplifier 821. When the first bias unit 811 is enabled according to the bias voltage of the bias circuit 81, the first bias unit 811 enables the pathway between the first voltage VDD and the first voltage terminal of the operational amplifier 821, thereby enabling the operational amplifier 821.

Further, the first bias unit 811 includes a first transistor T1, which includes a control terminal, a first pathway terminal and a second pathway terminal. The first pathway terminal of the first transistor T1 is connected to the first voltage VDD, and the second pathway terminal of the first transistor T1 is connected to the first voltage terminal of the operational amplifier 821.

As a self-bias circuit, the second bias unit 812 is connected between the first voltage VDD and the first branch 823 and the second branch 824. When the second bias unit 812 is enabled according to the bias voltage of the bias circuit 81, the second bias unit 812 enables the pathway between the first voltage VDD and the first branch 823 and the second branch 824, thereby providing a starting current to the first branch 823 and the second branch 824.

Further, the second bias unit 812 includes a self-bias transistor T and a fourth resistor R4. The self-bias transistor T includes a control terminal, a first pathway terminal and a second pathway terminal. The first pathway terminal of the self-bias transistor T is connected to the first voltage VDD.

The fourth resistor R4 includes a first terminal and a second terminal. The first terminal of the fourth resistor R4, the control terminal of the self-bias transistor T, the second pathway terminal of the self-bias transistor T and the control terminal of the first transistor T1 are connected together, and a junction thereof is defined as a fifth node E. the fifth node E is a bias voltage point configured to generate the bias voltage when being powered on. The second terminal of the fourth resistor R4 serves as an output terminal of the self-bias circuit 81 to connect the first branch 823 and the second branch 824.

The drive current of the first triode Q1 and the drive current of the second triode Q2 are supplied by the fourth transistor T4 and the self-bias transistor T. the gate of the fourth transistor T4 is driven by the operational amplifier 822, which is in a feedback loop. The self-bias transistor T is a self-bias structure, and its output current may be (VDD−VE−VGS)/R4, where VGS represents a gate-source voltage difference of the self-bias transistor T. The self-bias transistor T also may be used as a bias source of the operational amplifier 822, a thus a separate current source circuit is not needed.

The voltage value of the first voltage VDD in the circuit structure of this embodiment needs to meet certain conditions. In a specific embodiment, the first voltage VDD is greater than 1.8V, and its variation range is within ±15%. When the first voltage VDD is relatively small, the resistance value of the fourth resistor R4 may be lowered or the fourth resistor R4 may be removed, otherwise the self-bias transistor T cannot be enabled. When the first voltage VDD is relatively large, the resistance value of the fourth resistor R4 may be raised to lower the output current of the self-bias transistor T. In this way, zero current starting circuit is implemented without any external signal.

The bandgap reference power generation circuit provided by this embodiment is applicable to a circuit in which the first voltage VDD is a larger value. A starting current is provided using the second bias unit 812, and is directly used as the bias current of the operational amplifier 821 to implement zero current starting circuit without any additional bias circuit, thus further saving power consumption.

Figure 9:
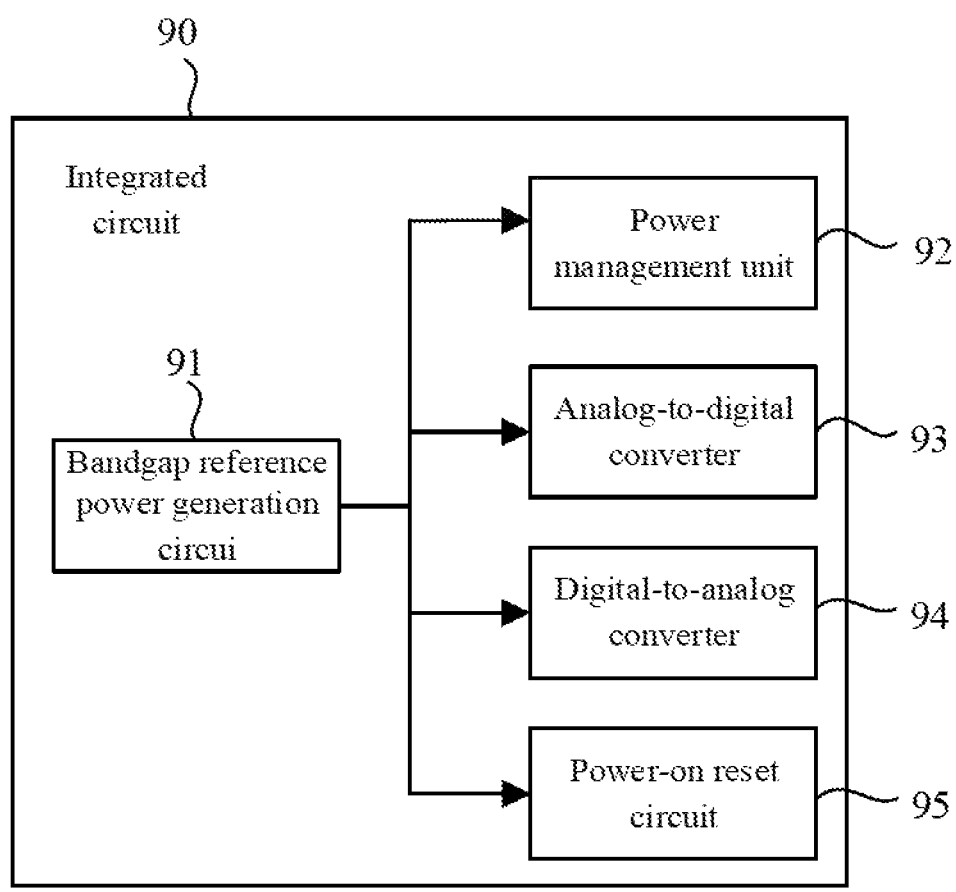
FIG. 9 is a schematic structural diagram of an integrated circuit according to an embodiment of the present disclosure.

Referring to FIG. 9, a schematic structural diagram of an integrated circuit according to an embodiment of the present disclosure is illustrated, the integrated circuit 90 includes the bandgap reference power generation circuit 91 in the foregoing embodiments.

Further, the integrated circuit 90 also includes at least one of a power management unit 92, an analog-to-digital converter (ADC) 93, a digital-to-analog converter (DAC) 94 and a power-on reset (POR) circuit 95, and at least one of the power management unit 92, the analog-to-digital converter 93, the digital-to-analog converter 94 and the power-on reset circuit 95 is connected to the bandgap reference power generation circuit 91, such that at least one of the power management unit 92, the analog-to-digital converter 93, the digital-to-analog converter 94 and the power-on reset circuit 95 is driven by a preset voltage or a preset current output by the bandgap reference power generation circuit 91.

The above are merely embodiments of the present disclosure and are not intended to limit the patent scope of the present disclosure. Any modifications of equivalent structure or equivalent process made on the basis of the contents of the description and accompanying drawings of the present disclosure or directly or indirectly applied to other related technical fields shall similarly fall within the scope of patent protection of the present disclosure.

What is claimed is:

1. A bandgap reference power generation circuit, comprising:
   a bias circuit configured to provide starting current according to a bias voltage;
   a bandgap reference core circuit connected to the bias circuit to receive the starting current and going into a stable operating state according to the starting current to output a preset voltage or preset current; wherein the bandgap reference core circuit comprises an operational amplifier connected to the bias circuit such that a first voltage terminal of the operational amplifier is connected to a first voltage via the bias circuit and a second voltage terminal of the operational amplifier is connected to a second voltage; and
   a bias voltage supply circuit connected to the bias circuit to supply the bias voltage to the bias circuit, comprising:
      a thirteenth transistor comprising a control terminal, a first pathway terminal and a second pathway terminal, wherein, the first pathway terminal is connected to the first voltage, the control terminal of the thirteenth transistor is connected to the second pathway terminal, and a connection point between the control terminal of the thirteenth transistor and the second pathway terminal serves as an output terminal of the bias voltage supply circuit to output the bias voltage; and
      a fourth resistor comprising a first terminal and a second terminal, wherein, the first terminal of the fourth resistor is connected to the second pathway terminal of the thirteenth transistor, and the second terminal of the fourth resistor is connected to the second voltage.

2. The bandgap reference power generation circuit according to claim 1, wherein the bandgap reference core circuit further comprises:

a drive circuit connected to an output terminal of the operational amplifier such that a magnitude of an output current of the drive circuit is determined according to an output of the operational amplifier;

a first branch connected to the drive circuit and the bias circuit to receive the starting current and receive a drive current provided by the drive circuit when the drive circuit is enabled; and a second branch connected to the drive circuit and the bias circuit to receive the starting current and receive a drive current provided by the drive circuit when the drive circuit is enabled;

wherein the first branch and the second branch are connected between the first voltage and the second voltage through the drive circuit and/or the bias circuit respectively.

3. The bandgap reference power generation circuit according to claim 2, wherein the bias circuit comprises:

a first bias unit connected to the bias voltage supply circuit and connected between the first voltage and a first voltage terminal of the operational amplifier; and a second bias unit connected to the bias voltage supply circuit and connected between the first voltage and the first branch and the second branch.

4. The bandgap reference power generation circuit according to claim 3, wherein the second bias unit comprises:

a second transistor comprising a control terminal, a first pathway terminal and a second pathway terminal, wherein, the control terminal of the second transistor is connected to the bias voltage supply circuit to receive the bias voltage, the first pathway terminal of the second transistor is connected to the first voltage, and the second pathway terminal of the second transistor is connected to the first branch; and a third transistor comprising a control terminal, a first pathway terminal and a second pathway terminal, wherein, the control terminal of the third transistor is connected to the bias voltage supply circuit to receive the bias voltage, the first pathway terminal of the third transistor is connected to the first voltage, and the second pathway terminal of the third transistor is connected to the second branch;

wherein the drive circuit comprises:

a fourth transistor comprising a control terminal, a first pathway terminal and a second pathway terminal, wherein, the control terminal of the fourth transistor is connected to the output terminal of the operational amplifier, the first pathway terminal of the fourth transistor is connected to the first voltage, and the second pathway terminal of the fourth transistor is connected to the first branch; and a fifth transistor comprising a control terminal, a first pathway terminal and a second pathway terminal, wherein, the control terminal of the fifth transistor is connected to the output terminal of the operational amplifier, the first pathway terminal of the fifth transistor is connected to the first voltage, and the second pathway terminal of the fifth transistor is connected to the second branch.

5. The bandgap reference power generation circuit according to claim 3, wherein the second bias unit comprises:

a third transistor comprising a control terminal, a first pathway terminal and a second pathway terminal, wherein, the control terminal of the third transistor is connected to the bias voltage supply circuit to receive the bias voltage, the first pathway terminal of the third transistor is connected to the first voltage, and the second pathway terminal of the third transistor is connected to both the first branch and the second branch;

wherein the drive circuit comprises:

a fourth transistor comprising a control terminal, a first pathway terminal and a second pathway terminal, wherein, the control terminal of the fourth transistor is connected to the output terminal of the operational amplifier, the first pathway terminal of the fourth transistor is connected to the first voltage, and the second pathway terminal of the fourth transistor is connected to both the first branch and the second branch.

6. The bandgap reference power generation circuit according to claim 3, wherein, the bias voltage supply circuit includes a starting circuit and a constant transconductance circuit, the constant transconductance circuit is configured to provide the bias voltage, the starting circuit is connected to the constant transconductance circuit to start the constant transconductance circuit when being powered on, such that the constant transconductance circuit provides the bias voltage to the bias circuit.

7. The bandgap reference power generation circuit according to claim 6, wherein, the output current of the bandgap reference power generation circuit includes a first current portion and a second current portion, the first current portion is fixed current supplied by the constant transconductance circuit, and the second current portion is controlled by a loop composed of the operational amplifier.

8. The bandgap reference power generation circuit according to claim 3, wherein the second bias unit is a self-bias circuit comprising:

a self-bias transistor comprising a control terminal, a first pathway terminal and a second pathway terminal, wherein, the first pathway terminal of the self-bias transistor is connected to the first voltage; and a resistor, comprising a first terminal and a second terminal, wherein the first terminal of the resistor, the control terminal of the self-bias transistor and the second pathway terminal of the self-bias transistor are connected together, and a junction thereof is defined as a fifth node, the fifth node is a bias voltage point configured to generate the bias voltage when being powered on, and the second terminal of the fourth resistor serves as an output terminal of the self-bias circuit to connect the first branch and the second branch.

9. An integrated circuit comprising a bandgap reference power generation circuit, wherein the bandgap reference power generation circuit comprises:

a bias circuit configured to provide starting current according to a bias voltage;

a bandgap reference core circuit connected to the bias circuit to receive the starting current and going into a stable operating state according to the starting current to output a preset voltage or preset current; wherein the bandgap reference core circuit comprises an operational amplifier connected to the bias circuit such that a first voltage terminal of the operational amplifier is connected to a first voltage via the bias circuit and a second voltage terminal of the operational amplifier is connected to a second voltage; and a bias voltage supply circuit connected to the bias circuit to supply the bias voltage to the bias circuit, comprising:

a thirteenth transistor comprising a control terminal, a first pathway terminal and a second pathway terminal, wherein, the first pathway terminal is connected to the first voltage, the control terminal of the thirteenth transistor is connected to the second pathway terminal, and a connection point between the control terminal of the thirteenth transistor and the second pathway terminal serves as an output terminal of the bias voltage supply circuit to output the bias voltage; and a fourth resistor comprising a first terminal and a second terminal, wherein, the first terminal of the fourth resistor is connected to the second pathway terminal of the thirteenth transistor, and the second terminal of the fourth resistor is connected to the second voltage.

10. The integrated circuit according to claim 9, further comprising at least one of a power management unit, an analog-to-digital converter, a digital-to-analog converter and a power-on reset circuit, wherein at least one of the power management unit, the analog-to-digital converter, the digital-to-analog converter and the power-on reset circuit is connected to the bandgap reference power generation circuit, such that at least one of the power management unit, the analog-to-digital converter, the digital-to-analog converter and the power-on reset circuit is driven by a preset voltage or preset current output by the bandgap reference power generation circuit.

* * * * *